United States Patent
Hu et al.

(10) Patent No.: US 6,211,069 B1
(45) Date of Patent: Apr. 3, 2001

(54) DUAL DAMASCENE PROCESS FLOW FOR A DEEP SUB-MICRON TECHNOLOGY

(75) Inventors: Chu-Wei Hu, Taichung; Jiue Wen Weng; Ruey Yun Shiue, both of Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/312,601

(22) Filed: May 17, 1999

(51) Int. Cl.$^7$ ................................ H01L 21/4763
(52) U.S. Cl. .................... 438/637; 438/638; 438/639
(58) Field of Search .................... 438/637, 638, 438/639

(56) References Cited

U.S. PATENT DOCUMENTS

| | | | |
|---|---|---|---|
| 5,604,156 | 2/1997 | Chung et al. | 437/195 |
| 5,614,765 | 3/1997 | Avanzino et al. | 257/774 |
| 5,726,499 | 3/1998 | Irinoda | 257/774 |
| 5,741,626 * | 4/1998 | Jain et al. | 430/314 |
| 5,753,967 * | 5/1998 | Lin | 257/635 |
| 5,795,823 | 8/1998 | Avanzino et al. | 438/639 |
| 5,814,527 | 9/1998 | Wolstenholme et al. | 438/5 |
| 6,010,962 * | 1/2000 | Liu et al. | 438/687 |

* cited by examiner

*Primary Examiner*—Jey Tsai
*Assistant Examiner*—Lynne A. Gurley
(74) *Attorney, Agent, or Firm*—George O. Saile; Stephen B. Ackerman

(57) ABSTRACT

A process for forming a dual damascene opening, in a composite insulator layer, comprised of an overlying, wide diameter opening, used to accommodate a metal interconnect structure, and comprised of an underlying, narrow diameter opening, used to accommodate a metal via structure, has been developed. The process features the use of conventional photolithographic and anisotropic dry etching procedures, used to create an initial dual damascene opening, in the composite insulator layer. The subsequent formation of insulator spacers, on the vertical sides of the initial dual damascene opening, however, results in a final dual damascene opening, featuring a diameter smaller than the diameter displayed with the initial dual damascene opening.

12 Claims, 3 Drawing Sheets

DUAL DAMASCENE PROCESS FLOW FOR A DEEP SUB-MICRON TECHNOLOGY

BACKGROUND OF THE INVENTION

(1) Field of the Invention

The present invention relates to processes used to fabricate semiconductor devices, and more specifically to a process used to create a small diameter opening, in an insulator layer, used to accommodate a dual damascene metal structure.

(2) Description of Prior Art

The use of damascene, or dual damascene metal structures, have allowed the semiconductor industry to reduce process complexity and cost. The ability to fabricate an overlying, wide diameter, metal interconnect structure, and an underlying, narrow diameter, metal via structure, using only a single metal deposition, and patterning procedure, has allowed the cost and process complexity objectives to be realized. A dual damascene opening, formed in a composite insulator layer, comprised of a wide diameter opening, and of an underlying, narrower diameter opening, is used to accommodate the subsequent dual damascene metal structure. However as demands for sub-micron devices increase, the photolithographic limits, in regards to the critical dimension of the narrow diameter opening, of the dual damascene opening, becomes critical.

This invention will teach a process in which a dual damascene opening, in a composite insulator layer, is used to accommodate a subsequent dual damascene metal structure, comprised of an overlying, wide diameter, metal interconnect structure, and an underlying, narrow diameter, metal via structure. However to further decrease the diameter of the subsequent metal via structure, in an effort to increase device density, a novel spacer technology is employed. The use of insulator spacers, formed on the exposed sides of the dual damascene opening, result in a narrowing of the narrow diameter opening, thus allowing metal via structures to be realized, that are narrower in diameter than counterparts formed in openings achieved using only photolithographic patterning procedures. In addition this invention allows the photolithographic process window, for either critical dimension, or overlay, to be increased, thus avoiding possible image, or overlay problems, encountered with the use of more aggressive groundrules. The use of the spacers reduce the diameter of the openings, to a level only achievable using riskier photolithographic procedures. Prior art, such as Irinoda, in U.S. Pat. No. 5,726,499, describes a process in which spacers are used as part of an etch mask, to decrease the diameter of an etch mask opening, used to define an underlying, smaller diameter opening. In contrast, this invention does not use the spacer as an etch mask, but fabricates the spacer on the walls of a formed, small diameter opening, which was achieved using only conventional photolithographic and dry etching procedures, followed by the narrowing of the narrow diameter opening, via formation of the insulator spacer.

SUMMARY OF THE INVENTION

It is an object of this invention to create a dual damascene metal structure, in an opening formed in a composite insulator layer.

It is another object of this invention to form an initial dual damascene opening, in a composite insulator layer, using photolithographic and dry etching procedures, with the dual damascene opening, comprised of an overlying, wide diameter opening, and of an underlying, narrow diameter opening.

It is still another object of this invention to form insulator spacers on the sides of the initial dual damascene opening, to create a final dual damascene opening, now featuring a smaller diameter than the initial dual damascene opening.

It is still yet another object of this invention to allow a larger photolithographic process window, in terms of critical dimension and overlay, to be used to create the initial dual damascene opening, in a composite insulator layer, followed by the creation of the smaller diameter, final dual damascene opening, obtained via creation of the insulator spacers.

In accordance with the present invention, a method of creating a final dual damascene opening, in a composite insulator layer, featuring a reduction of the diameter of an initial dual damascene opening, via the creation of insulator spacers, on the sides of the initial dual damascene opening, has been developed. A composite insulator layer, comprised of an underlying silicon oxide layer, a silicon nitride stop layer, and an overlaying silicon oxide layer, is deposited. Conventional photolithographic and dry etching procedures, are employed to create an initial dual damascene opening, in the composite insulator layer, comprised of a overlying, wide diameter opening, and an underlying, narrow diameter opening. An insulator layer is next deposited, then subjected to an anisotropic reactive ion etching procedure, to create insulator spacers on the sides of the initial dual damascene opening, resulting in a final dual damascene opening, featuring smaller diameter openings, than previously exhibited with the initial dual damascene opening. Deposition of a barrier layer, and a metal layer, followed by removal of unwanted regions of metal, and of barrier layer, result in a dual damascene metal structure, located in the final dual damascene opening, in the composite insulator layer.

BRIEF DESCRIPTION OF THE DRAWINGS

The object and other advantages of this invention are best described in the preferred embodiments with reference to the attached drawings that include.

DESCRIPTION OF THE PREFERRED EMBODIMENT

The method of creating a dual damascene metal structure, in a final dual damascene opening, in a composite insulator layer, in which the diameter of an initial dual damascene opening, formed via conventional photolithographic and dry etching procedures, is reduced via formation of insulator spacers, on the sides of the initial dual damascene opening, will now be described in detail.

Figure 1:
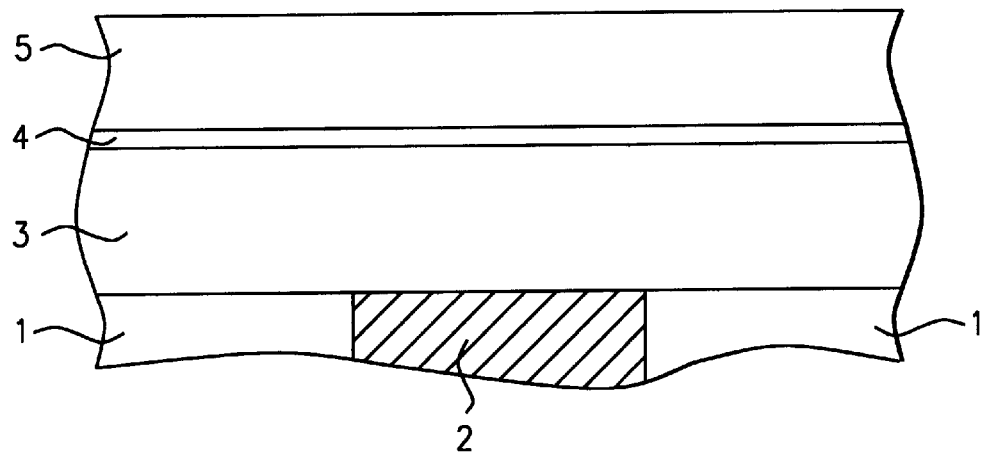
FIGS. 1–6, which schematically, in cross-sectional style, describe key stages of fabrication used to create a dual damascene metal structure, in a final dual damascene opening, in a composite insulator, featuring the reduction of the diameter of an initial dual damascene type opening, via creation of insulator spacers, on the sides of the initial dual damascene opening.

Insulator layer 1, shown schematically in FIG. 1, comprised of either silicon oxide, borosilicate glass, or borophosphosilicate glass, is used to accommodate underlying, metal interconnect structure 2, which can be comprised of copper, aluminum, or a refractory metal such as tungsten. Insulator layer 3, comprised of silicon oxide, is next obtained via either low pressure chemical vapor deposition, (LPCVD), plasma enhanced chemical vapor deposition, (PECVD), or high density plasma chemical vapor deposition, (HDPCVD), procedures, at a thickness between about 3000 to 8000 Angstroms. A silicon nitride layer 4, to be used as an etch stop layer, for subsequent formation of an initial dual damascene opening, is deposited on silicon oxide layer 3, at a thickness between about 150 to 2000 Angstroms, via LPCVD or PECVD procedures. Overlying insulator layer 5, again comprised of silicon oxide, is next deposited on silicon nitride layer 4, using LPCVD, PECVD, or HDPCVD procedures, at a thickness between about 3000 to 12000 Angstroms. The result of these depositions are schematically shown in FIG. 1.

Figure 2:
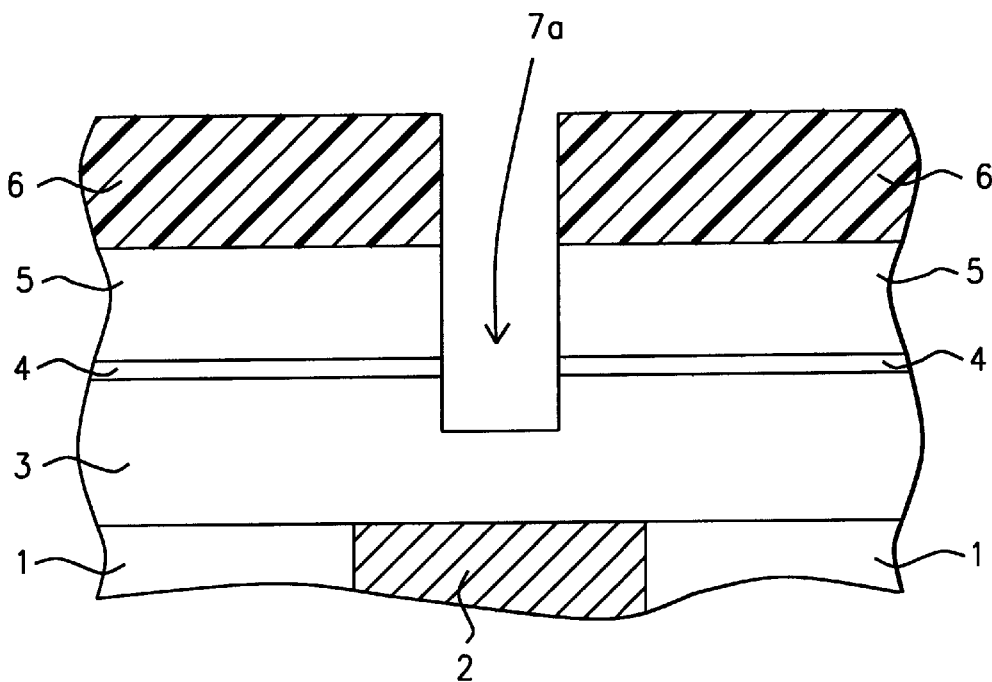
Figure 3:
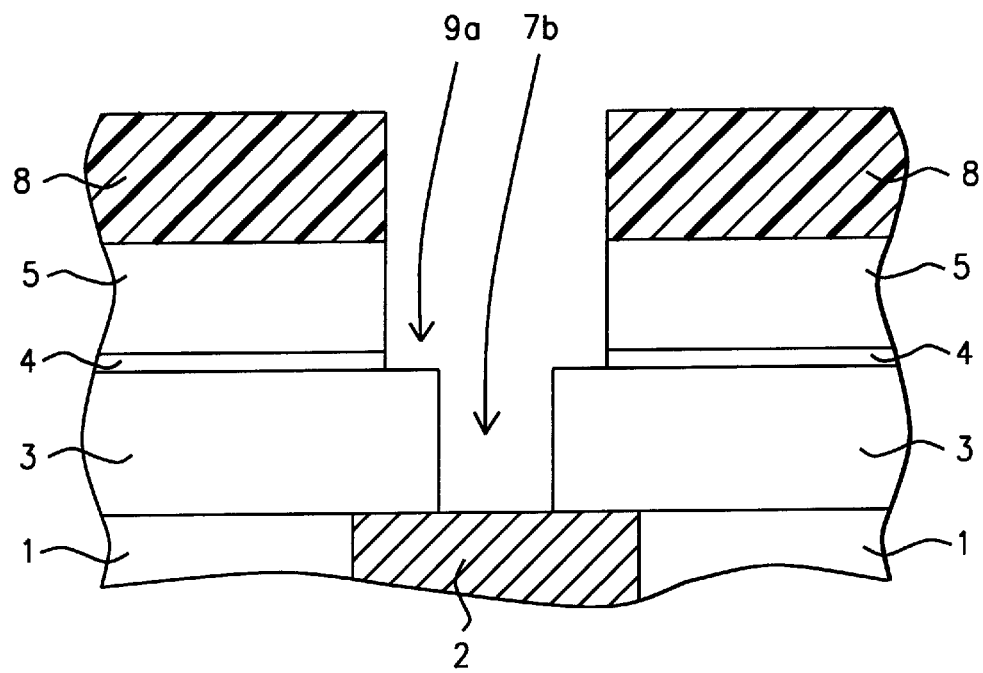

An initial dual damascene opening is next created in the composite insulator layer, and described using FIGS. 2–3. Photoresist shape 6, is used as an etch mask, to define, via an anisotropic, reactive ion etching, (RIE), procedure, first narrow diameter opening 7a, in silicon oxide layer 5, in silicon nitride layer 4, and partially in silicon oxide layer 3. First narrow diameter opening 7a, with a diameter between about 0.35 to 0.45 um, is created using $CHF_3$ as an etchant for silicon oxide layer 5, and for silicon oxide layer 3, while $CF_4$ is used as an etchant for silicon nitride layer 4. This is schematically shown in FIG. 2. It would be desirable to use an even narrower opening, than first narrow diameter opening 7a, however the critical dimension control, and overlay, needed for the narrower opening would be difficult to achieve using conventional photolithographic and dry etching procedures. Therefore a method to further reduce the diameter, of a narrow diameter opening, will be subsequently addressed via formation of insulator spacers, on the sides of the narrow diameter opening.

After removal of photoresist shape 6, via plasma oxygen ashing and careful wet cleans, photoresist shape 8, is formed, and used as an etch mask, to define, via an anisotropic RIE procedure, first wide diameter opening 9a, in silicon oxide layer 5. This is schematically shown in FIG. 3. First wide diameter opening 9a, with a diameter between about 0.45 to 0.55 um, is selectively created using $CHF_3$ as an etchant. This procedure, while removing regions of silicon oxide layer 5, exposed in the opening of photoresist shape 8, resulting in first wide diameter opening 9a, also removes the region of silicon oxide layer 3, exposed in the first narrow diameter opening, in silicon nitride layer 4, resulting in the formation of second narrow diameter opening 7b, shown schematically in FIG. 3. The etch rate ratio, for this procedure, using $CHF_3$ as an etchant, of silicon oxide to silicon nitride, is about 7 to 1. This allows the regions of silicon nitride layer 4, exposed in first wide diameter opening 9a, to behave as an etch mask, and allow first narrow diameter opening 7a, in the upper portion of the composite insulator layer, to be transferred to the lower portion of the composite insulator layer. Second narrow diameter opening 7b, schematically shown in FIG. 3, exposes a portion of the top surface of underlying metal interconnect structure 2. Regions of silicon nitride layer 4, remaining after formation of second narrow diameter opening 7b, are removed via a selective RIE procedure, using $CF_4$ as an etchant.

Figure 4:
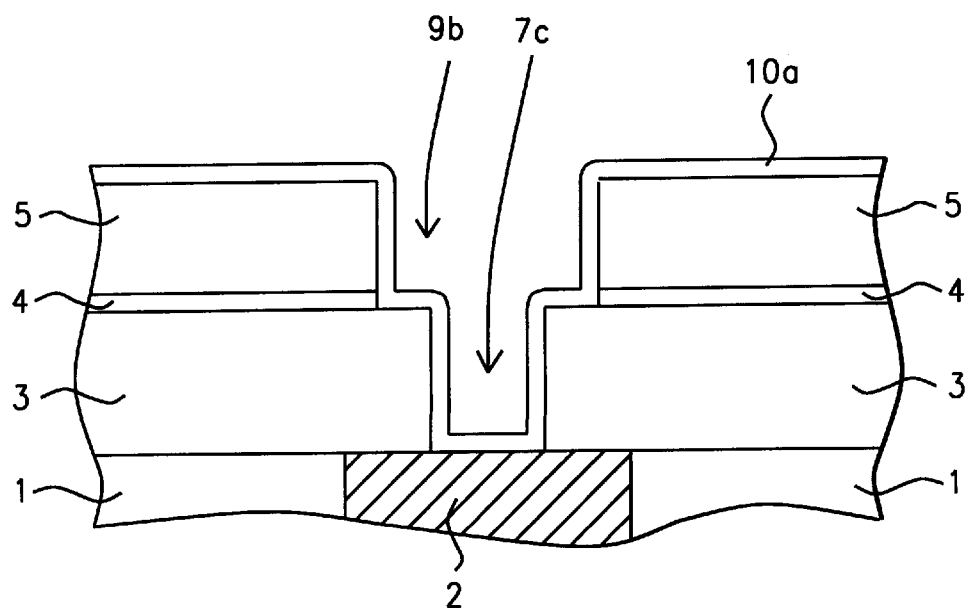
Figure 5:
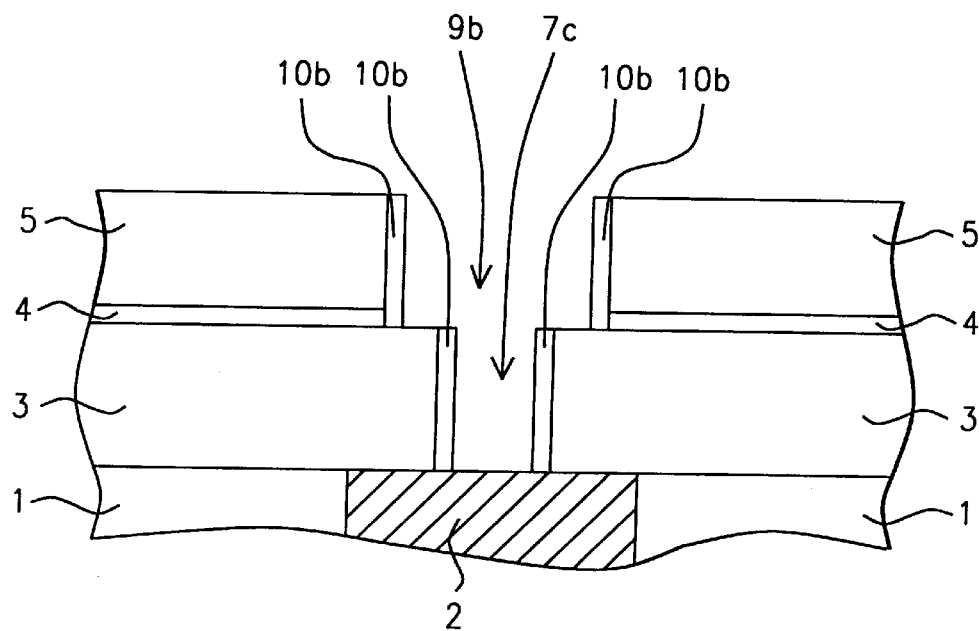

The process of reducing the diameter of the initial dual damascene opening is now described using FIGS. 4–5. After removing photoresist shape 8, via plasma oxygen ashing and careful wet cleans, insulator layer 10a, comprised of either silicon oxide, or silicon nitride, is conformally deposited, via LPCVD, or PECVD procedures, to a thickness between about 0.04 to 0.06 um. This is schematically shown in FIG. 4. An anisotropic RIE procedure, using $CHF_3$ as an etchant, if layer 10a, is a silicon oxide layer, or using $CF_4$ as an etchant, if layer 10a, is a silicon nitride layer, is employed to create insulator spacers 10b, on the vertical walls of the initial dual damascene opening, resulting in a final, and narrower, dual damascene opening. The final dual damascene opening, schematically shown in FIG. 5, is now comprised of second wide diameter opening 9b, now featuring a diameter between about 0.35 to 0.45 um, and comprised of underlying, third narrow diameter type opening 7c, now featuring a diameter between about 0.25 to 0.35 um. Third narrow diameter type opening 7c, formed via conventional patterning procedures, and via the use of sidewall insulator spacers 10b, would be difficult to achieve, in terms of critical dimension and overlay, using only conventional patterning, photolithographic and dry etching, procedures.

Figure 6:
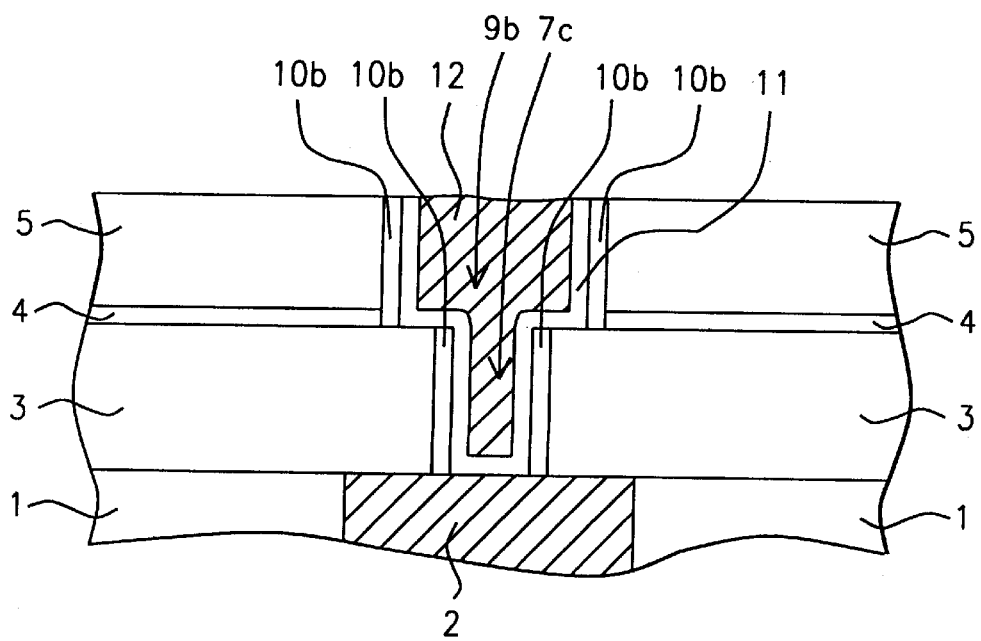

The formation of dual damascene metal structure 12, in the final dual damascene opening, is next addressed and schematically shown in FIG. 6. A tantalum nitride layer 11, is first deposited via R.F. sputtering, at a thickness between about 50 to 300 Angstroms. Tantalum nitride layer 11, will serve as a barrier layer, preventing a subsequent, overlying copper layer, from reacting, or poisoning, adjacent materials. A copper layer 12, is than deposited, via R.F. sputtering, or via chemical vapor deposition procedures, at a thickness between about 2000 to 20000 Angstroms, completely filling the final dual damascene opening. Chemical mechanical polishing procedures, or a selective RIE procedure, using $Cl_2$ as an etchant, is used to remove portions of copper layer 12, and portions of tantalum nitride layer 11, from the top surface of silicon oxide layer 5, resulting in the dual damascene metal structure, contacting the portion of underlying metal interconnect structure 2, exposed at the bottom of the final dual damascene opening.

While this invention has ben particularly shown and described with reference to, the preferred embodiments thereof, it will be understood by those skilled in the art that various changes in form and details may be made without departing from the spirit or scope of this invention.

What is claimed is:

1. A method of forming a dual damascene metal structure, in a final dual damascene opening, in a composite insulator layer, in which insulator spacers are used on the sides of an initial dual damascene opening, to decrease the diameter of the final dual damascene opening, comprising the steps of:

providing an underlying metal interconnect structure;

depositing a first silicon oxide layer;

depositing a silicon nitride layer;

depositing a second silicon oxide layer;

using a first photoresist shape as an etch mask, to form a first narrow diameter opening, in said second silicon oxide layer, and in said silicon nitride layer;

using a second photoresist shape as an etch mask to selectively, via a reactive ion etching (RIE), procedure, form a first wide diameter opening in said second silicon oxide layer, with said first wide diameter opening terminating on a top surface of said silicon nitride layer, and exposing a portion of unetched silicon nitride layer in said first wide diameter opening, while using said first narrow diameter opening, and said unetched portions of silicon nitride layer, exposed in said first wide diameter opening, as an etch mask to create a second narrow diameter opening, in said first silicon oxide layer, exposing a portion of the top surface of said underlying metal interconnect structure;

removing said unetched portions of silicon nitride layer, exposed in said first wide diameter opening, creating said initial dual damascene opening, comprised of a second wide diameter opening, in said second silicon oxide layer, and in said silicon nitride layer, overlying said second narrow diameter opening, in said first silicon oxide layer;

depositing an insulator layer;

performing an anisotropic reactive ion etch, (RIE), procedure, to create insulator spacers on the vertical sides of said initial dual damascene opening, resulting in the formation of said final dual damascene opening, comprised of a third wide diameter opening, featuring said insulator spacers on the vertical sides of said second wide diameter opening, and comprised of an underlying third narrow diameter opening, featuring said insulator spacers on the vertical sides of said second narrow diameter opening;

depositing a barrier layer;

depositing a metal layer; and removing portions of said metal layer, and of said barrier layer, located on the top surface of said second silicon oxide layer, to form said dual damascene metal structure, in said final dual damascene opening, in said composite insulator layer.

2. The method of claim 1, wherein said first silicon oxide layer is obtained via LPCVD, PECVD, or HDPCVD procedures, at a thickness between about 3000 to 8000 Angstroms.

3. The method of claim 1, wherein said silicon nitride layer is obtained via LPCVD or PECVD procedures, at a thickness between about 150 to 2000 Angstroms.

4. The method of claim 1, wherein said second silicon oxide layer is obtained via LPCVD, PECVD, or HDPCVD procedures, at a thickness between about 3000 to 12000 Angstroms.

5. The method of claim 1, wherein said first narrow diameter opening, is formed with a diameter between about 0.35 to 0.45 um, in said second silicon oxide layer, and in said silicon nitride layer, using $CHF_3$ as an etchant for said second silicon oxide layer, and using $CF_4$ as an etchant for said silicon nitride layer.

6. The method of claim 1, wherein said first wide diameter opening, is formed with a diameter between about 0.45 to 0.55 um, in said second silicon oxide layer, using $CHF_3$ as an etchant.

7. The method of claim 1, wherein said second narrow diameter opening, is formed with a diameter between about 0.35 to 0.45 um, in said first silicon oxide layer, using $CHF_3$ as an etchant, using said narrow opening, in said silicon nitride layer, as an etch mask, with an etch rate ratio of said first silicon oxide layer, to said silicon nitride layer, between about 7 to 1.

8. The method of claim 1, wherein said insulator spacers are comprised of silicon oxide, formed via deposition of a silicon oxide layer, using LPCVD, PECVD, or HDPCVD procedures, at a thickness between about 0.04 to 0.06 um, then followed by an anisotropic RIE procedure, using $CHF_3$ as an etchant.

9. The method of claim 1, wherein said insulator spacers are comprised of silicon nitride, formed via deposition of a silicon nitride layer, using LPCVD or PECVD procedures, at a thickness between about 0.04 to 0.06 um, then followed by an anisotropic RIE procedure, using $CF_4$ as an etchant.

10. The method of claim 1, wherein the diameter of said third narrow diameter opening, in said first silicon oxide layer, is between about 0.25 to 0.35 um.

11. The method of claim 1, wherein said barrier layer, is a tantalum nitride layer, obtained via R.F. sputtering, at a thickness between about 50 to 300 Angstroms.

12. The method of claim 1, wherein said metal layer, is a copper layer, obtained via R.F. sputtering, or via chemical vapor deposition procedures, at a thickness between about 2000 to 20000 Angstroms.

* * * * *